United States Patent
Ting et al.

(10) Patent No.: US 7,475,305 B2
(45) Date of Patent: Jan. 6, 2009

(54) METHOD OF HIGH SPEED DATA RATE TESTING

(75) Inventors: Tah-Kang Joseph Ting, Hsinchu (TW); Shih-Hsing Wang, Hsinchu (TW); Hong-Jie Chen, Hsinchu (TW)

(73) Assignee: Etron Technology, Inc., Hsin-Chu (TW)

( * ) Notice: Subject to any disclaimer, the term of this patent is extended or adjusted under 35 U.S.C. 154(b) by 519 days.

(21) Appl. No.: 11/174,859

(22) Filed: Jul. 5, 2005

(65) Prior Publication Data

US 2005/0243613 A1     Nov. 3, 2005

Related U.S. Application Data

(62) Division of application No. 10/167,858, filed on Jun. 11, 2002, now Pat. No. 6,943,044.

(51) Int. Cl.
 *G01R 31/3177* (2006.01)
 *G01R 31/40* (2006.01)
(52) U.S. Cl. ........................... 714/724; 714/733
(58) Field of Classification Search ........................ None
 See application file for complete search history.

(56) References Cited

U.S. PATENT DOCUMENTS

| | | | |
|---|---|---|---|
| 4,412,327 A | 10/1983 | Fox et al. ........................ 371/21 |
| 6,196,677 B1 * | 3/2001 | Spano ........................ 351/44 |
| 6,240,042 B1 | 5/2001 | Li ................................ 365/233 |
| 2001/0033182 A1 * | 10/2001 | Uehara ........................ 324/765 |
| 2001/0038106 A1 * | 11/2001 | Coteus et al. ................ 257/200 |

* cited by examiner

*Primary Examiner*—Cynthia Britt
*Assistant Examiner*—Dipakkumar Gandhi
(74) *Attorney, Agent, or Firm*—Saile Ackerman LLC; Stephen B. Ackerman

(57) ABSTRACT

A method to optimize a data strobe for a multiple circuit, automatic test system is achieved. The method comprises, first, probing, in parallel, a circuit group wherein the circuit group comprises a plurality of circuits. Next, a data strobe of an automatic test system is initialized to a strobe set point relative to a system clock cycle. Next, the function of each of the circuits is partially tested, in parallel, using the strobe set point. Next, the circuit yield of the circuit group from the step of partially testing at the strobe set point is logged. Next, the data strobe is updated to a new strobe set point. Next, the steps of testing, logging, and updating are repeated until a specified range of strobe set points is completed. Finally, the data strobe is set for the circuit group to the strobe set point associated with the highest circuit yield.

17 Claims, 5 Drawing Sheets

METHOD OF HIGH SPEED DATA RATE TESTING

This is a division of patent application Ser. No. 10/167,858, filing date Jun. 11, 2002, now U.S. Pat. No. 6,943,044 assigned to the same assignee as the present invention

BACKGROUND OF THE INVENTION (1) Field of the Invention

The invention relates to a method to testing an integrated circuit device, and, more particularly, to a method of high speed data rate testing using an optimized data strobe for a parallel, multiple circuit, automated test system.

(2) Description of the Prior Art

An important step in the manufacture of integrated circuit devices is testing. Due to the increasing complexity and speed of IC devices, testing presents unique challenges. Typically, IC devices are tested several times in the manufacturing sequence. In particular, individual IC die are tested at the wafer level, prior to sawing and packaging. The packaged parts are then re-tested to insure functionality.

A challenging circuit testing scenario involves very high speed devices. In particular, high data rate devices, such as double data rate (DDR) DRAM devices present a unique challenge for the automated test system. A DDR DRAM is designed to provide data access at a rate of twice the system clock frequency, as will be described below.

Referring now to FIG. 1, an integrated circuit wafer 10 is shown. A plurality of IC circuit die 14 is arrayed across the wafer 10. Two die groups, DIE GROUP A 18 and DIE GROUP B 22, are highlighted. Each die group 18 and 22 comprises an array of four die. A particularly useful concept in the prior art is to test a die group, such as group A or B in the illustration, simultaneously using a multiple die, automatic wafer test system. In this type of system, a die group, typically comprising between about 16 and 32 die, is simultaneously probed. Then the entire die group is simultaneously tested, in parallel, using a common tester program. The data outputs of each die, such as die 1, 2, 3, and 4 in GROUP A, are evaluated independently to determine if each circuit has passed or failed the test. This type of testing scheme is particularly effective on memory devices and represents a significant cost reduction compared to a single die testing system.

Referring now to FIG. 2, an automated test system 25 is shown for testing multiple packaged circuits 26A, 26B, 26C, and 26D. In this case, a group of packaged devices 26A, 26B, 26C, and 26D is tested simultaneously by a multiple circuit, automatic test system 25. This multiple package testing system works the same as the multiple die system of FIG. 1 that is discussed above. Both of these multiple circuit, simultaneous testing systems present unique challenges for tester timing as will be discussed below.

Referring now to FIG. 3, the timing relationships between the test system clock 30, the device under test (DUT) data output lines 34, and the tester data strobe 38 for a double data rate (DDR) DRAM device is shown. The test system clock 30 is generated by the automated test system. In this case, the system clock has a frequency of 250 MHz. The system clock 30 is used to drive the DUT, in this case a DDR DRAM. In response to the test pattern input, the DUT generates an output 34. In this case, the data out signal 34 comprises the data bus lines (D0-Dn) of the DDR DRAM. The DDR DRAM is designed to output data on every half-clock cycle of the system clock such that data out 34 has an effective frequency of 500 MHz or double the system clock rate.

In the illustration, the data out signal 34 is shown as changing states every half-clock cycle. Further, data out 34 takes a finite time to reach final state. The data strobe signal 38 is generated by the tester. The tester uses the data strobe 38 to time the sampling of the data out signal 34. As can be seen from the timing diagram, the timing of the data strobe 38 is critical for accurately acquiring the data output value 34.

Referring now to FIG. 4, a difficulty encountered in multiple circuit testing is illustrated. For example, a multiple circuit test may be performed on the exemplary die groups of FIG. 1 or the package group of FIG. 2. Further, in this example, the DUT devices comprise DDR DRAM devices. Referring again to FIG. 3, the DIE 1 data output 64, DIE 2 data output 68, and DIE 3 data output 72 are shown. The data strobe 60 is also shown. In this case, significant process variation between the plurality of circuits in the circuit group causes significant variation in the timing performance of each circuit. However, a single strobe timing is used for all of the circuit during the simultaneous, parallel test.

As can be seen by the marking points 76, 80, and 84, the data lines 64, 68, and 72, are in different states at the strobe 60 enable. In the prior art, the timing of the data strobe 60 is static. That is, a single strobe timing, with respect to the system clock, is used for every circuit group tested. However, the static strobe timing causes correctly functioning circuit die to fail the test, especially those circuits at the extremes of the processing window. This represents a significant loss of product and profits for the manufacturer.

Several prior art inventions relate to data strobe and to testing. U.S. Pat. No. 6,240,042 to Li describes a method for generating a data strobe signal for a DDR DRAM having improved synchronization. U.S. Pat. No. 4,412,327 to Fox et al discloses a test circuit for testing an IC.

SUMMARY OF THE INVENTION

A principal object of the present invention is to provide an effective method for testing an integrated circuit device.

A further object of the present invention is to provide a method to optimize a data strobe for a multiple circuit, automatic test system.

Another further object of the present invention is to optimize the data strobe for a multiple circuit, parallel test, such that circuit yield is maximized.

Another further object of the present invention is to optimize the data strobe by sample testing the circuit group.

Another further object of the present invention is to provide a method for use in testing either integrated circuit die or packaged parts.

Another further object of the present invention is to provide a method to test a plurality of circuits using a multiple circuit, automatic test system where the data strobe is optimized.

Another further object of the present invention is to provide a method to optimize the data strobe for a single strobe per clock cycle and for a double strobe per clock cycle system.

In accordance with the objects of this invention, a method to optimize a data strobe for a multiple circuit, automatic test system is achieved. The method comprises, first, probing, in parallel, a circuit group wherein the circuit group comprises a plurality of circuits. Next, a data strobe of an automatic test system is initialized to a strobe set point relative to a system clock cycle. Next, the function of each of the circuits is partially tested, in parallel, using the strobe set point. Next, the circuit yield of the circuit group from the step of partially testing at the strobe set point is logged. Next, the data strobe is updated to a new strobe set point. Next, the steps of testing, logging, and updating are repeated until a specified range of strobe set points is completed. Finally, the data strobe is set for the circuit group to the strobe set point associated with the highest circuit yield.

Also in accordance with the objects of this invention, a method to test a plurality of circuits using a multiple circuit, automatic test system is achieved. The method comprises, first, initializing an automatic test system to a first circuit group comprising a plurality of circuit groups. Each circuit group comprises a plurality of circuits. The first circuit group is considered a current circuit group. Next, the current circuit group is tested by a method comprising, first, probing, in parallel, the current circuit group. Next, the data strobe of the automatic test system is initialized to a strobe set point relative to a system clock cycle. Next, the function of each of the circuits is partially tested, in parallel, using the strobe set point. Next, the circuit yield of the current circuit group is logged. Next, the data strobe is updated to a new strobe set point. The steps of testing, logging, and updating are repeated until a specified range of strobe set points is completed. Finally, the data strobe for the current circuit group is set to the strobe set point associated with the highest circuit yield. The testing method resumes with testing the current circuit group using the optimized data strobe. Next, the system indexes to the next circuit group and this circuit group is considered the current group. Finally, the steps of testing the current circuit group and indexing to the next circuit group are repeated until all the circuit groups have been tested.

BRIEF DESCRIPTION OF THE DRAWINGS

In the accompanying drawings forming a material part of this description, there is shown.

DESCRIPTION OF THE PREFERRED EMBODIMENTS

The preferred embodiments of the present invention disclose a method of testing a high speed data rate integrated circuit device. More particularly, a method of optimizing the data strobe for a parallel, multiple circuit, automated test system is disclosed. The method is applicable for either simultaneous, multiple die or multiple package testing. It should be clear to those experienced in the art that the present invention can be applied and extended without deviating from the scope of the present invention.

Figure 1:
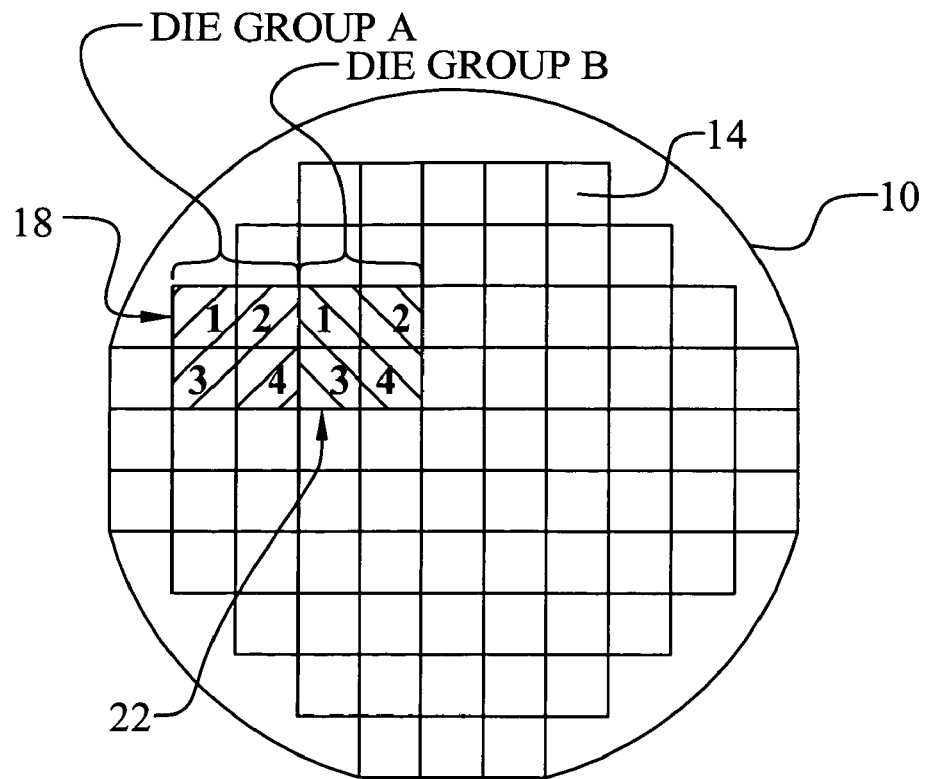
FIG. 1 illustrates the die group concept whereby multiple die on an integrated circuit wafer are tested simultaneously using a multiple die, automatic wafer test system.
Figure 2:
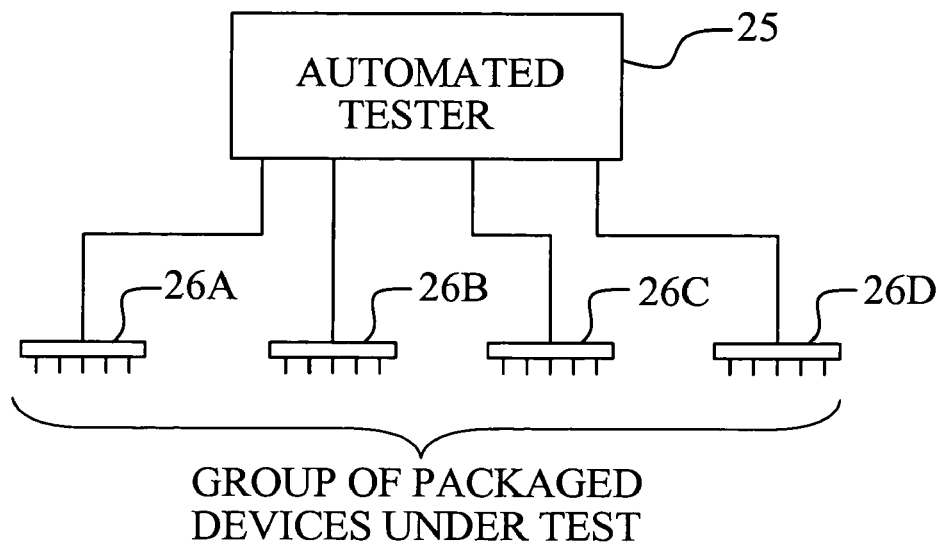
FIG. 2 illustrates the package group concept whereby multiple packaged circuits are tested simultaneously using a multiple package, automatic test system.
Figure 3:
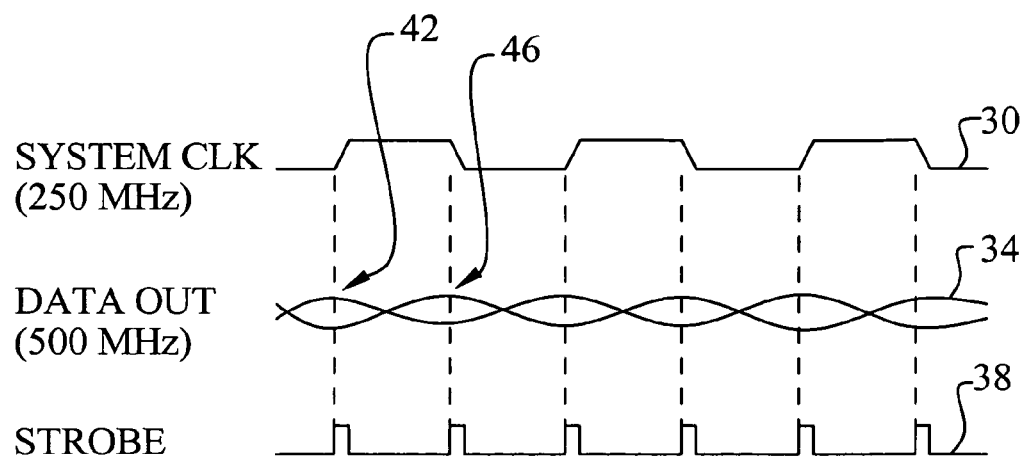
FIG. 3 illustrates the timing relationships between the test system clock, the device under test (DUT) data output lines, and the tester data strobe for a double data rate (DDR) DRAM device.
Figure 4:
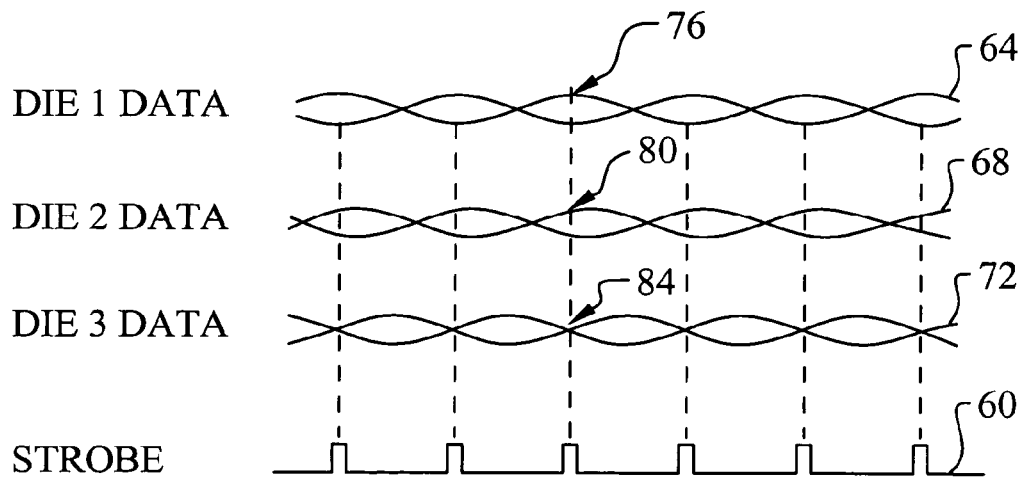
FIG. 4 illustrates the prior art difficulty in using a static data strobe set point for a parallel, multiple circuit test.
Figure 5:
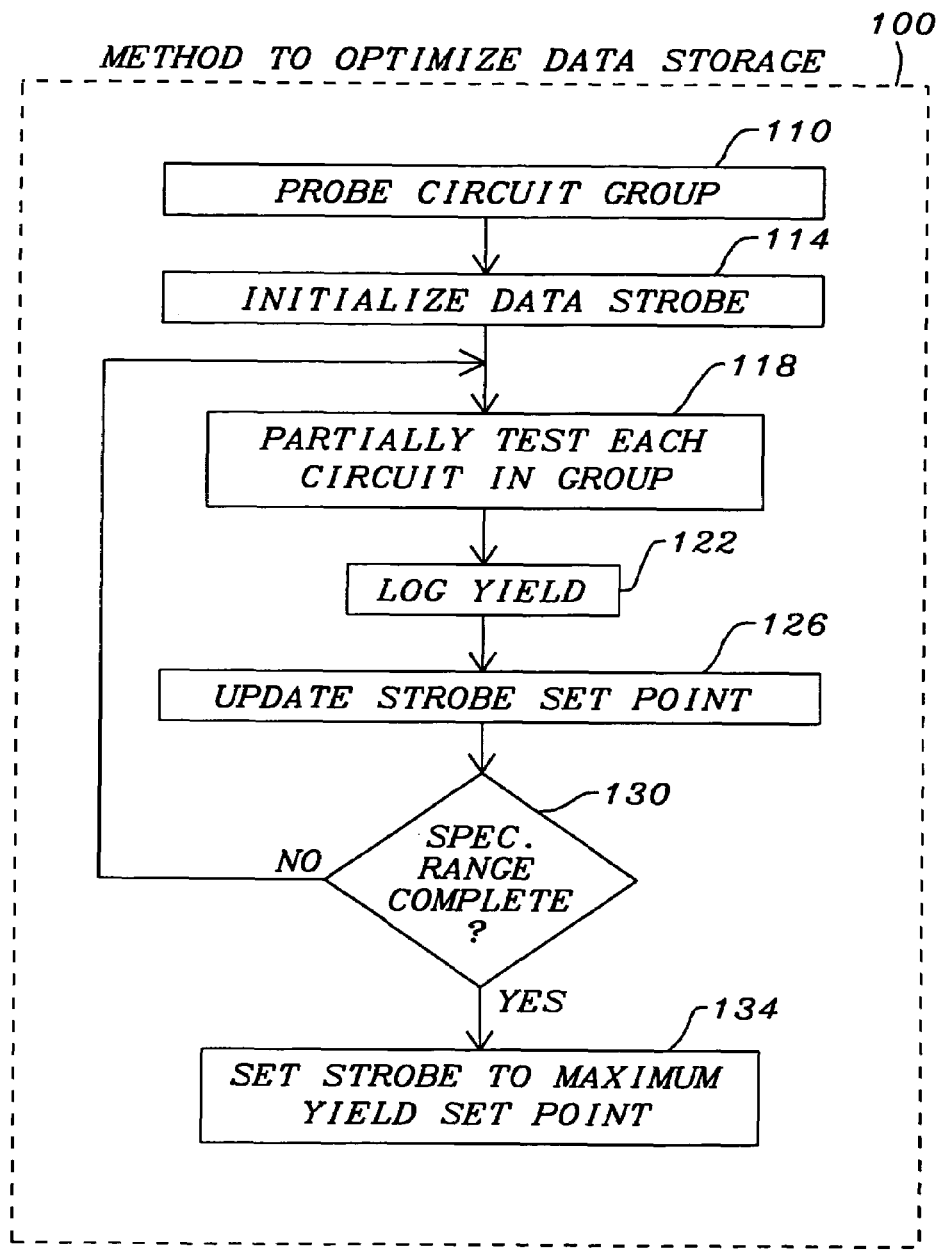
FIG. 5 illustrates the first preferred embodiment of the present invention method to optimize a data strobe for a multiple circuit, automatic test system.

Referring now to FIG. 5, the first preferred embodiment of the present invention method 100 to optimize a data strobe for a multiple circuit, automatic test system is shown. Several important features of the present invention are shown in the illustration and are further describe below. The method 100 is particularly effective for improving circuit yield during a wafer test or during a packaged device final test. The method 100 comprises, first, probing, in parallel, a circuit group. In the case of a wafer test, a group of die on an integrated circuit wafer is probed simultaneously. In the case of packaged parts, a group of packaged parts is probed simultaneously. The term circuit is used herein to mean either an integrated circuit die on a wafer or a packaged integrated circuit. The circuit group comprises a plurality of circuits in step 110. Next, the data strobe of an automatic test system is initialized to a first strobe set point relative to the system clock cycle in step 114. Next, the function of each of the circuits in the group is partially tested, in parallel, using the strobe set point in step 118. Next, the circuit yield of the circuit group from the step of partially testing at the strobe set point is logged in step 122. Next, the data strobe is updated to a new strobe set point in step 126. Next, the steps of testing, logging, and updating are repeated until a specified range of strobe set points is completed in step 130. Finally, the data strobe is set for the circuit group to the strobe set point associated with the highest circuit yield in step 134.

When the circuit group is probed in step 110, preferably between about 2 and 128 circuits are probed. As an important feature, only a part of the function of each circuit is tested in step 118. Preferably, the device under test (DUT) is a memory device and, more preferably, the DUT is a DDR DRAM. In this case, only a part of the memory array is tested during the sample test of step 118. By simultaneously testing only a part of the function of each of the circuits in the circuit group, the capability of the current strobe setting can be evaluated quickly at each set point in step 118.

Figure 6:
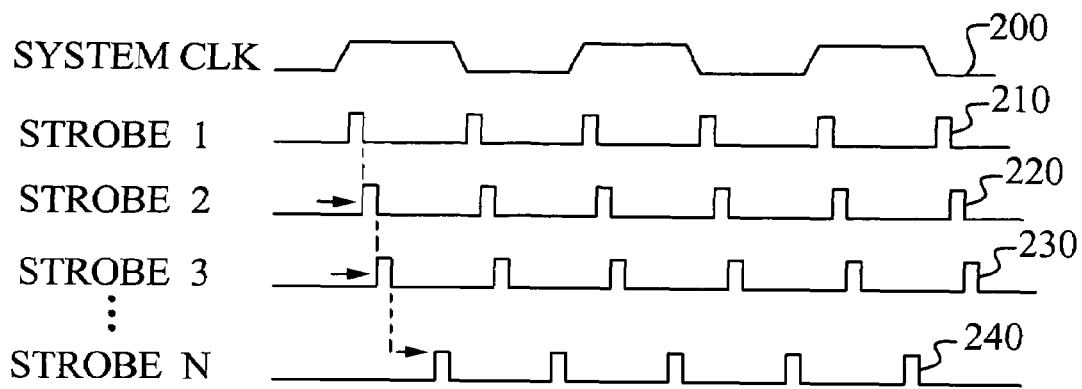
FIG. 6 illustrates the timing relationships for updating the data strobe by incrementing between a lower limit and an upper limit of the specified range.

There are several possible methods of updating the strobe set point, in step 126. While the exact method is not critical to the primary features of the present invention, two such methods are worthy of discussion. Referring now to FIG. 6, a first method of updating the data strobe is shown. In this method, the strobe set point is incremented between a lower limit and an upper limit of the specified range. The data strobe is initialized, in step 114, to STROBE 1 210 and is related, in this example, to the SYSTEM CLK 200 as shown. The partial testing of each circuit in the circuit group in step 118 is performed using the STROBE 1 set point and the yield is logged in step 122 as discussed above. The data strobe is then updated by incrementing the timing location forward with respect to the SYSTEM CLK 200 to the relationship shown by STROBE 2 220. This strobe is evaluated using the partial test. This process is repeated as the data strobe position is moved to STROBE 3 230 and so on. The strobe position is finally moved to the STROBE N 240 position where the specified range of data strobe values is completed. This method insures that the entire range of strobe values is evaluated with respect to circuit yield.

Figure 7:
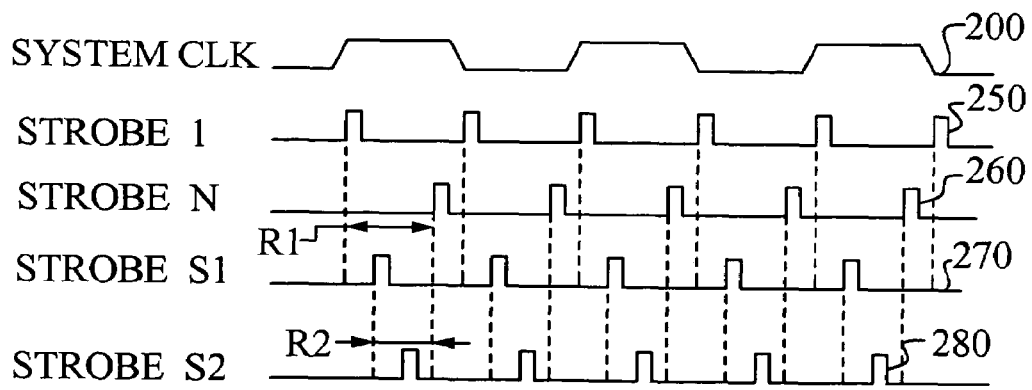
FIG. 7 illustrates the timing relationships for updating the data strobe by binary searching between a lower limit and an upper limit of the specified range.

Referring now to FIG. 7, an alternative method of performing the updating of the data strobe set point step 126 is illustrated. In this method, a binary search is performed to select the optimal strobe location. There are several ways of performing binary search operations that are well known in the art. As an example, the data strobe is initialized to STROBE 1 250. However, after the STROBE 1 yield is evaluated, the set point is set to the other end of the strobe range, STROBE N 260. Next, the range between the STROBE 1 and STROBE N locations, R1, is divided to select the mid-range set point shown as STROBE S1 270. After the yield is evaluated for the STROBE S1 set point, a new set point is selected. At this point, the yield data must be considered. The next data strobe set point is selected based on whether placing the strobe nearer STROBE 1 or nearer STROBE N appears to improve the yield. This decision is made based on which set point, STROBE 1 or STROBE N, displayed the better yield. In the example case, the STROBE N offers the better yield. Therefore, the range between STROBE S1 and STROBE N, R2, is split to select set point STROBE S2. This process continues until a final data strobe set point is selected. The binary search method of updating the data strobe value has the advantage of reducing the number of set points that must be evaluated and, therefore, reduces the time required to select the optimum data strobe setting.

It is important to note that the novel method of optimizing the data strobe set point for a multiple circuit test is illustrated for the case of data lines of double data rate devices, such as DDR DRAM devices. DDR devices are especially demanding to test for high speed applications. The ability to optimize the data strobe, based on sample testing the circuit group, improves the circuit yield for the multiple circuit test when compared to the prior art method where the strobe location was fixed. In addition, the method will work for single data rate devices where a single strobe per system clock cycle is used. Further, the method may be used to select the optimum location of multiple data strobes for a single circuit. For example, the individual data strobes for several outputs of a circuit may each be optimized using the method herein disclosed.

Figure 8:
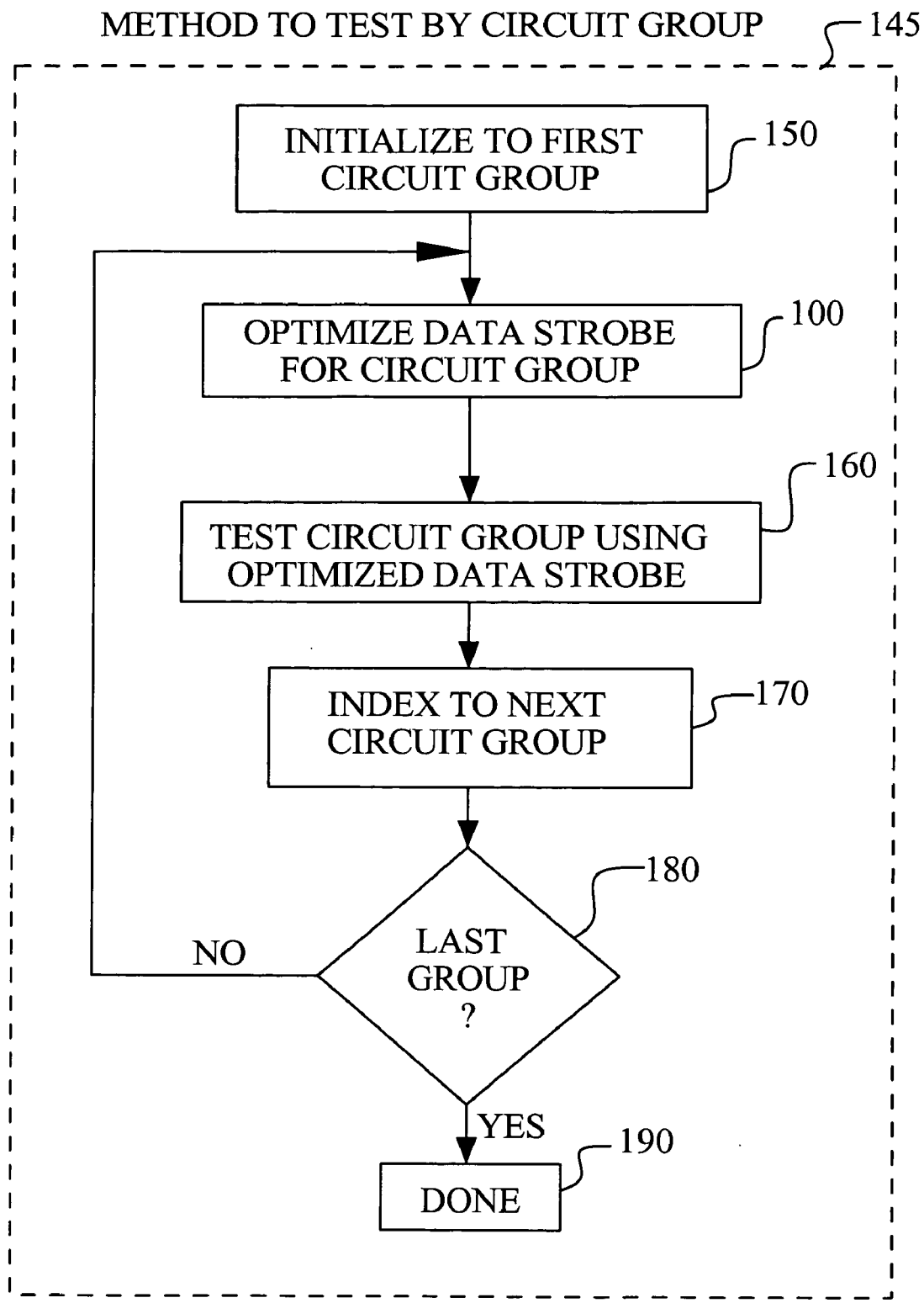
FIG. 8 illustrates the second preferred embodiment of the present invention method to test a plurality of circuits using a multiple circuit, automatic test system.

Referring now to FIG. 8, a second preferred embodiment of the present invention is shown. A method 145 to test a plurality of circuits using a multiple circuit, automatic test system is illustrated and described below. The method 145 comprises, first, initializing the automatic test system to a first circuit group of a plurality of circuit groups in step 150. Each circuit group further comprises a plurality of circuits. The first circuit group is considered a current circuit group. Next, the current circuit group is tested by a method comprising, first, probing, in parallel, the current circuit group. Next, the data strobe is optimized for the current circuit group in step 100 using the method of optimization of the first embodiment. The testing method resumes with testing the current circuit group using the optimized data strobe in step 160. Next, the system indexes to the next circuit group, and this circuit group is considered the current group in step 170. Finally, the steps of testing the current circuit group and indexing to the next circuit group are repeated until all the circuit groups have been tested in steps 180 and 190. The method of the second embodiment can be extended to cover multiple data strobes and single or double strobe locations per clock cycle as in the first embodiment.

The advantages of the present invention may now be summarized. An effective method for testing an integrated circuit device is achieved. The method optimizes a data strobe for a multiple circuit, automatic test system, such that die yield is maximized. The data strobe is optimized by sample testing the circuit group. The method is effective for either wafer test or packaged test. Finally, the method to optimize the data strobe is achieved for a single strobe per clock cycle and for a double strobe per clock cycle system.

As shown in the preferred embodiments, the novel method of testing an integrated circuit device using a multiple circuit, test system provides an effective alternative to the prior art.

While the invention has been particularly shown and described with reference to the preferred embodiments thereof, it will be understood by those skilled in the art that various changes in form and details may be made without departing from of the spirit and scope of the invention.

What is claimed is:

1. A method to test a plurality of circuits using a multiple circuit, automatic test system comprising:
    initializing an automatic test system to a first circuit group comprising a plurality of circuit groups wherein each said circuit group comprises a plurality of circuits and wherein said first circuit group is considered a current circuit group;
    thereafter testing said current circuit group wherein said testing comprises:
        probing, in parallel, said current circuit group;
        thereafter initializing a data strobe of said automatic test system to a strobe set point relative to a system clock cycle;
        thereafter partially testing, in parallel, the function of each said circuit using said strobe set point;
        logging a circuit yield of said circuit group from said step of partially testing at said strobe set point;
        thereafter updating said data strobe to a new said strobe set point;
        thereafter repeating said steps of testing, logging, and updating until a specified range of said strobe set points is completed;
        thereafter setting said data strobe for said circuit group to said strobe set point associated with the highest said circuit yield; and
        thereafter testing said current circuit group using said optimized data strobe;
    thereafter indexing said system to next said circuit group which is now considered said current group; and
    thereafter repeating said steps of testing said current circuit group and indexing to next said circuit group until all said circuit groups have been tested.

2. The method according to claim 1 wherein said circuit group comprises a group of die on an integrated circuit wafer.

3. The method according to claim 1 wherein said circuit group comprises a group of packaged integrated circuit devices.

4. The method according to claim 1 wherein each said circuit comprises a memory device.

5. The method according to claim 1 wherein said data strobe comprises a single strobe for every said system clock cycle.

6. The method according to claim 1 wherein said data strobe comprises two strobes for every system clock cycle.

7. The method according to claim 1 wherein said step of updating said data strobe to a new said strobe set point comprises incremental stepping between a lower limit and an upper limit of said specified range.

8. The method according to claim 1 wherein said step of updating said data strobe to a new said strobe set point comprises binary searching between a lower limit and an upper limit of said specified range.

9. The method according to claim 1 wherein at least two said data strobes are optimized.

10. A method to test a plurality of circuits using a multiple circuit, automatic test system comprising:
    initializing an automatic test system to a first circuit group comprising a plurality of circuit groups wherein each said circuit group comprises a plurality of circuits and wherein said first circuit group is considered a current circuit group;

thereafter testing said current circuit group wherein said testing comprises:

probing, in parallel, said current circuit group;

thereafter initializing a data strobe of said automatic test system to a strobe set point relative to a system clock cycle wherein said data strobe comprises a single strobe for every said system clock cycle;

thereafter partially testing, in parallel, the function of each said circuit using said strobe set point;

logging a circuit yield of said circuit group from said step of partially testing at said strobe set point;

thereafter updating said data strobe to a new said strobe set point;

thereafter repeating said steps of testing, logging, and updating until a specified range of said strobe set points is completed;

thereafter setting said data strobe for said circuit group to said strobe set point associated with the highest said circuit yield; and thereafter testing said current circuit group using said optimized data strobe;

thereafter indexing said system to next said circuit group which is now considered said current group; and thereafter repeating said steps of testing said current circuit group and indexing to next said circuit group until all said circuit groups have been tested.

11. The method according to claim 10 wherein said circuit group comprises a group of die on an integrated circuit wafer.

12. The method according to claim 10 wherein said circuit group comprises a group of packaged integrated circuit devices.

13. The method according to claim 10 wherein each said circuit comprises a memory device.

14. The method according to claim 10 wherein said data strobe further comprises a second strobe for every system clock cycle.

15. The method according to claim 10 wherein said step of updating said data strobe to a new said strobe set point comprises incremental stepping between a lower limit and an upper limit of said specified range.

16. The method according to claim 10 wherein said step of updating said data strobe to a new said strobe set point comprises binary searching between a lower limit and an upper limit of said specified range.

17. The method according to claim 10 wherein at least two said data strobes are optimized.

* * * * *